(12) United States Patent
Huo et al.

(10) Patent No.: US 11,251,195 B2
(45) Date of Patent: Feb. 15, 2022

(54) THREE-DIMENSIONAL MEMORY DEVICE WITHOUT GATE LINE SLITS AND METHOD FOR FORMING THE SAME

(71) Applicant: YANGTZE MEMORY TECHNOLOGIES CO., LTD., Wuhan (CN)

(72) Inventors: Zongliang Huo, Wuhan (CN); Haohao Yang, Wuhan (CN); Wei Xu, Wuhan (CN); Ping Yan, Wuhan (CN); Pan Huang, Wuhan (CN); Wenbin Zhou, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 0 days.

(21) Appl. No.: 16/670,586

(22) Filed: Oct. 31, 2019

(65) Prior Publication Data
US 2020/0395375 A1     Dec. 17, 2020

Related U.S. Application Data

(63) Continuation of application No. PCT/CN2019/102116, filed on Aug. 23, 2019.

(30) Foreign Application Priority Data

Jun. 17, 2019 (CN) .......................... 201910522002.X

(51) Int. Cl.
*H01L 27/11582* (2017.01)
*H01L 27/1157* (2017.01)
*H01L 27/11565* (2017.01)

(52) U.S. Cl.
CPC .... *H01L 27/11582* (2013.01); *H01L 27/1157* (2013.01); *H01L 27/11565* (2013.01)

(58) Field of Classification Search
CPC ....................... H01L 27/11582; H01L 27/1157
See application file for complete search history.

(56) References Cited

U.S. PATENT DOCUMENTS 9,754,963 B1   9/2017 Kawamura et al.
10,050,054 B2  8/2018 Zhang et al.
(Continued)

FOREIGN PATENT DOCUMENTS

CN     104659033 A     5/2015
CN     105097822 A    11/2015
(Continued)

OTHER PUBLICATIONS

International Search Report issued in corresponding International Application No. PCT/CN2019/102133, dated Mar. 20, 2020, 5 page.
(Continued)

*Primary Examiner* — Allen L Parker
*Assistant Examiner* — Gustavo G Ramallo
(74) *Attorney, Agent, or Firm* — Bayes PLLC

(57) ABSTRACT

Embodiments of structure and methods for forming a three-dimensional (3D) memory device are provided. In an example, the 3D memory device includes a stack structure. The stack structure includes a plurality of conductor layers and a plurality of insulating layers interleaved over a substrate. The plurality of conductor layers include a pair of top select conductor layers divided by a first top select structure and a pair of bottom select conductor layers divided by a bottom select structure. The first top select structure and the bottom select structure extend along a horizontal direction and are aligned along a vertical direction. A plurality of channel structures extend along a vertical direction and into the substrate and are distributed on both sides of the top select structure and the bottom select structure.

20 Claims, 7 Drawing Sheets

(56) References Cited

U.S. PATENT DOCUMENTS

| | | | |
|---|---|---|---|
| 10,269,820 B1 | 4/2019 | Kaminaga | |
| 2008/0164491 A1* | 7/2008 | Liu | .................... H01L 29/6656 257/190 |
| 2012/0094453 A1 | 4/2012 | Han et al. | |
| 2012/0098049 A1 | 4/2012 | Moon et al. | |
| 2013/0168800 A1 | 7/2013 | Shim et al. | |
| 2014/0217488 A1 | 8/2014 | Thimmegowda et al. | |
| 2014/0284697 A1 | 9/2014 | Wang et al. | |
| 2015/0318301 A1 | 11/2015 | Lee et al. | |
| 2015/0357341 A1 | 12/2015 | Yeh et al. | |
| 2016/0126252 A1 | 5/2016 | Tsuda et al. | |
| 2016/0336338 A1 | 11/2016 | Song et al. | |
| 2016/0358933 A1* | 12/2016 | Rabkin | ............... H01L 29/7926 |
| 2017/0047334 A1 | 2/2017 | Lu et al. | |
| 2017/0117289 A1 | 4/2017 | Liu et al. | |
| 2017/0309339 A1 | 10/2017 | Hsiung et al. | |
| 2018/0097009 A1 | 4/2018 | Zhang et al. | |
| 2018/0233513 A1 | 8/2018 | Zhang et al. | |
| 2018/0366483 A1 | 12/2018 | Choi | |
| 2019/0067314 A1 | 2/2019 | Lu et al. | |
| 2019/0096899 A1 | 3/2019 | Tagami et al. | |
| 2020/0185408 A1* | 6/2020 | Song | .................. G11C 16/0483 |

FOREIGN PATENT DOCUMENTS

| | | |
|---|---|---|
| CN | 107810554 A | 3/2018 |
| CN | 108511454 A | 9/2018 |
| CN | 108538841 A | 9/2018 |
| CN | 108831887 A | 11/2018 |
| CN | 108987405 A | 12/2018 |
| CN | 109314118 A | 2/2019 |
| CN | 109346477 A | 2/2019 |
| CN | 109690776 A | 4/2019 |
| CN | 109698201 A | 4/2019 |
| CN | 109727995 A | 5/2019 |
| CN | 109786382 A | 5/2019 |
| CN | 110112134 A | 8/2019 |
| WO | 2019022814 A1 | 1/2019 |

OTHER PUBLICATIONS

Written Opinion of the International Searching Authority issued in corresponding International Application No. PCT/CN2019/102133, dated Mar. 20, 2020, 5 page.
International Search Report issued in corresponding International Application No. PCT/CN2019/102116, dated Mar. 18, 2020, 4 page.
Written Opinion of the International Searching Authority issued in corresponding International Application No. PCT/CN2019/102116, dated Mar. 18, 2020, 5 page.
International Search Report issued in corresponding International Application No. PCT/CN2019/102121, dated Mar. 18, 2020, 5 page.
Written Opinion of the International Searching Authority issued in corresponding International Application No. PCT/CN2019/102121, dated Mar. 18, 2020, 5 page.
International Search Report issued in corresponding International Application No. PCT/CN2019/102114, dated Mar. 25, 2020, 4 pages.
Written Opinion of the International Searching Authority issued in corresponding International Application No. PCT/CN2019/102114, dated Mar. 25, 2020, 5 pages.
Machine-generated English translation of CN108538841, total pp. 12 (Year: 2018).

* cited by examiner

THREE-DIMENSIONAL MEMORY DEVICE WITHOUT GATE LINE SLITS AND METHOD FOR FORMING THE SAME

CROSS-REFERENCE TO RELATED APPLICATIONS

This application is continuation of International Application No. PCT/CN2019/102116, filed on Aug. 23, 2019, entitled "THREE-DIMENSIONAL MEMORY DEVICE WITHOUT GATE LINE SLITS AND METHOD FOR FORMING THE SAME," which claims the benefit of priority to Chinese Patent Application No. 201910522002.X, filed on Jun. 17, 2019, both of which are incorporated herein by reference in their entireties. This application is also related to U.S. application Ser. No. 16/670,571, filed on Oct. 31, 2019, entitled "METHODS FOR FORMING THREE-DIMENSIONAL MEMORY DEVICE WITH SUPPORT STRUCTURE AND RESULTING THREE-DIMENSIONAL MEMORY DEVICE," U.S. application Ser. No. 16/670,579, filed on Oct. 31, 2019, entitled "THREE-DIMENSIONAL MEMORY DEVICE WITH SUPPORT STRUCTURES IN SLIT STRUCTURES AND METHOD FOR FORMING THE SAME," and U.S. application Ser. No. 16/670,594, filed on Oct. 31, 2019, entitled "THREE-DIMENSIONAL MEMORY DEVICE WITH SUPPORT STRUCTURES IN GATE LINE SLITS AND METHODS FOR FORMING THE SAME," all of which are hereby incorporated by reference in their entireties.

BACKGROUND

Embodiments of the present disclosure relate to three-dimensional (3D) memory devices without gate line slits (GLSs), and methods for forming the 3D memory devices.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. 3D memory architecture includes a memory array and peripheral devices for controlling signals to and from the memory array.

SUMMARY

Embodiments of 3D memory devices and methods for forming the 3D memory devices are provided.

In one example, a 3D memory device includes a stack structure. The stack structure may include a plurality of conductor layers and a plurality of insulating layers interleaved over a substrate. The plurality of conductor layers may include a pair of top select conductor layers divided by a first top select structure and a pair of bottom select conductor layers divided by a bottom select structure. The first top select structure and the bottom select structure may extend along a horizontal direction and are aligned along a vertical direction. A plurality of channel structures may extend along a vertical direction and into the substrate and are distributed on both sides of the top select structure and the bottom select structure.

In another example, a method for forming a 3D memory device includes forming a bottom select structure extending along a vertical direction through a bottom conductor layer over a substrate and along a horizontal direction to divide the bottom conductor layer into a pair of bottom select conductor layers, forming a plurality of conductor layers and a plurality of insulating layers interleaved on the pair of bottom select conductor layers and the bottom select structure, and forming a plurality of channel structures extending along the vertical direction through the pair of bottom select conductor layers, the plurality of conductor layers, and the plurality of insulating layers and into the substrate. The method may further include forming a first top select structure extending along the vertical direction through a top conductor layer of the plurality of conductor layers and along the horizontal direction to divide the top conductor layer into a pair of top select conductor layers. The first top select structure and the bottom select structure may be aligned along the vertical direction and may divide a plurality of memory cells formed by the plurality of conductor layers and the plurality of channel structures into a pair of memory blocks.

In a different example, a method for forming a 3D memory device includes forming a bottom select structure extending along a horizontal direction and dividing a bottom conductor layer over a substrate into a pair of bottom select conductor layers, forming a plurality of conductor layers and a plurality of insulating layers interleaved on the pair of bottom select conductor layers and the bottom select structure, and forming a plurality of channel structures extending along a vertical direction through the pair of bottom select conductor layers, the plurality of conductor layers, and the plurality of insulating layers and into the substrate. The plurality of channel structures may be distributed symmetrically on each side of the bottom select structure along another horizontal direction perpendicular to the horizontal direction. In some embodiments, the method also includes forming a plurality of top select structures extending along the horizontal direction and dividing a top conductor layer of the plurality of conductor layers into a plurality of top select conductor layers. The top select structures may include a first top select structure aligned with the bottom select structure along the vertical direction and at least one second top select structure on each side of the first top select structure along the other horizontal direction. The first top select structure and the bottom select structure may divide a plurality memory cells formed by the plurality of channel structures and the plurality of conductor layers into a pair of memory blocks, and the at least one second top structure on each side of the first top select structure dividing a respective memory block into a plurality of memory fingers.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
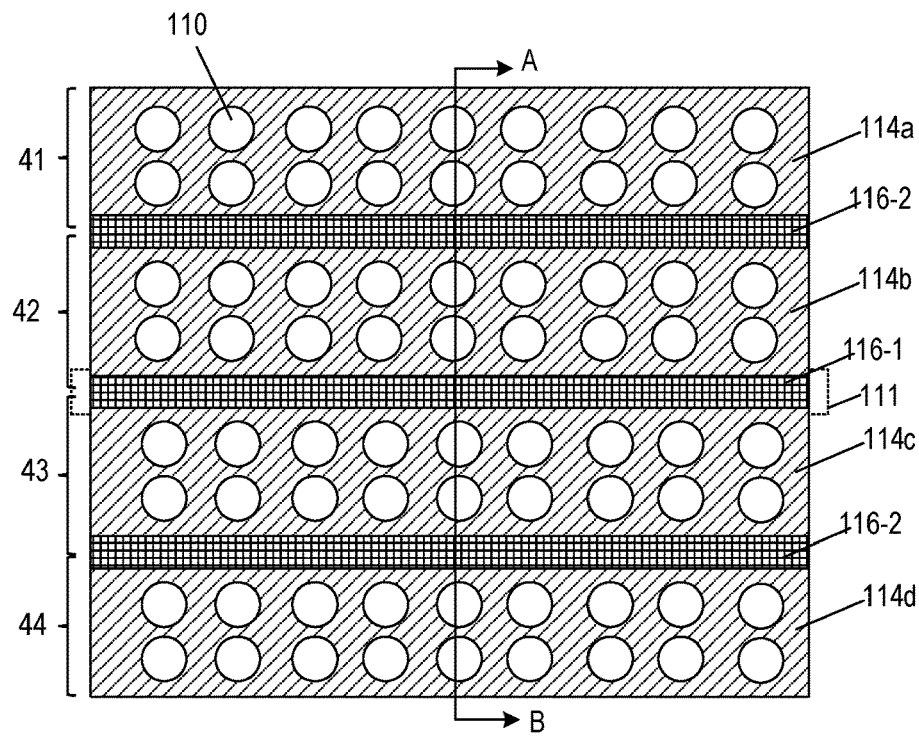
FIG. 1A illustrates a plan view of an exemplary 3D memory device without GLSs, according to some embodiments of the present disclosure.

Embodiments of the present disclosure will be described with reference to the accompanying drawings.

DETAILED DESCRIPTION

Although specific configurations and arrangements are discussed, this should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, a staircase structure refers to a set of surfaces that include at least two horizontal surfaces (e.g., along x-y plane) and at least two (e.g., first and second) vertical surfaces (e.g., along z-axis) such that each horizontal surface is adjoined to a first vertical surface that extends upward from a first edge of the horizontal surface, and is adjoined to a second vertical surface that extends downward from a second edge of the horizontal surface. A "step" or "staircase" refers to a vertical shift in the height of a set of adjoined surfaces. In the present disclosure, the term "staircase" and the term "step" refer to one level of a staircase structure and are used interchangeably. In the present disclosure, a horizontal direction can refer to a direction (e.g., the x-axis or the y-axis) parallel with the top surface of the substrate (e.g., the substrate that provides the fabrication platform for formation of structures over it), and a vertical direction can refer to a direction (e.g., the z-axis) perpendicular to the top surface of the structure.

NAND flash memory devices, widely used in various electronic produces, are non-volatile light weighted, of low power consumption and good performance. Currently, planar NAND flash memory devices have reached its storage limit. To further increase the storage capacity and reduce the storage cost per bit, 3D NAND memory devices have been proposed. The process to form an existing 3D NAND memory device often includes the following operations. First, a stack structure of a plurality of interleaved sacrificial layers and insulating layers are formed over a substrate. A channel hole is formed extending in the stack structure. The bottom of the channel hole is etched to form a recess in the substrate. An epitaxial portion is formed at the bottom of the channel hole by selective epitaxial growth. A semiconductor channel, conductively connected to the epitaxial portion, is formed in the channel hole. The sacrificial layers can be removed and replaced with conductor layers. The conductor layers function as word lines in the 3D NAND memory device.

An existing 3D NAND memory device often includes a plurality of memory blocks. Adjacent memory blocks are often separated by a gate line slit (GLS), in which an ACS is formed. In the fabrication method to form the existing 3D NAND memory device, the feature size of the GLS is susceptible to fluctuation, potentially affecting the performance of the 3D NAND memory device.

The present disclosure provides 3D memory devices (e.g., 3D NAND memory devices) without GLSs or ACSs in the GLSs, and methods for forming the 3D memory devices. The 3D memory devices employ a top select structure and a bottom select structure in a stack structure as a division of memory blocks. The top select structure and the bottom select structure, respectively made of dielectric materials, are located at the top and the bottom portions of the stack structure, being aligned with each other along the vertical direction. The top select structure and the bottom select structure each divides at least one conductor layer to form a respective pair of select conductor layers (e.g., pair of top/bottom select conductor layers, functioning as top/bottom select gates). The select conductor layers can be respectively applied with voltage to select a desired memory block for read/write/erase operations. In some embodiments, the 3D memory devices include one or more other top select structures in a memory block aligned in parallel with the top select structure, dividing the respective select conductor layer into a plurality of top select sub-conductor layers, each corresponding to a memory finger. A top select sub-conductor layer and a corresponding bottom select conductor layer may be respectively applied with voltage to select a desired memory finger and/or a desired memory page. By applying the top and bottom select structures as divisions of memory blocks and memory fingers, no GLSs or ACSs in the GLSs are formed, avoiding fluctuation to the feature size of GLSs. In some embodiments, the substrate is biased or grounded as a body source. The methods are used to form a stack structure of a single-deck structure or a multi-deck structure (e.g., dual-deck structure). In some embodiments, the conductor layers of the stack structure are formed by direct deposition of a conductor material, instead of by a gate replacement process in which sacrificial layers are replaced with the conductor material to form the conductor layers. The fabrication of the 3D memory device can be simplified.

Figure 1B:
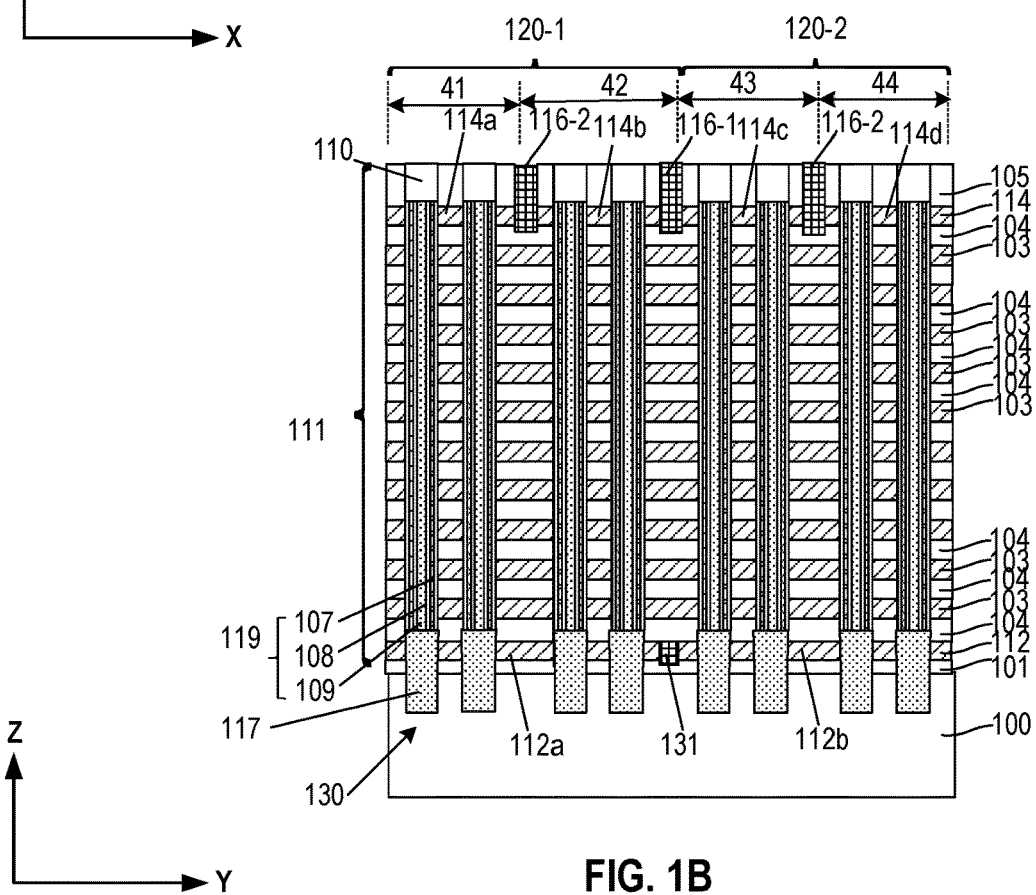
FIG. 1B illustrates a cross-sectional view of the 3D memory device illustrated in FIG. 1A along the A-B direction, according to some embodiments of the present disclosure.

FIG. 1A illustrates a plan view of an exemplary 3D memory device 150, according to some embodiments. FIG. 1B illustrates a cross-sectional view of the 3D memory device 150 shown in FIG. 1A along the A-B direction. As shown in FIGS. 1A and 1B, 3D memory device 150 may include a substrate 100, a buffer oxide layer 101, and a stack structure 111 over buffer oxide layer 101. Stack structure 111 may include a plurality of conductor layers (i.e., a top conductor layer 114 having a pair of top select conductor layers, a bottom conductor layer 112 having a pair of bottom select conductor layers, and control conductor layers 103) and a plurality of insulating layers 104 interleaved over buffer oxide layer 101. Stack structure 111 may also include a dielectric cap layer 105 covering the plurality of conductor layers (i.e., 114, 103, and 112) and insulating layers 104. Stack structure 111 may also include a plurality of channel structures 130 extending from a top surface of dielectric cap layer 105 into substrate 100 along a vertical direction (e.g., the z-direction). Each channel structure 130 may include an epitaxial portion 117 at a bottom of the channel structure, a drain structure 110 at the top of the channel structure, and a semiconductor channel 119 between epitaxial portion 117 and drain structure 110. Epitaxial portion 117 may contact and be conductively connected to substrate 100, and semiconductor channel 119 may contact and be conductively connected to drain structure 110 and epitaxial portion 117. A plurality of memory cells may be formed by semiconductor channels 119 and control conductor layers 103.

Stack structure 111 may also include a first top select structure 116-1 and a bottom select structure 131 aligned along the vertical direction to divide the memory cells into a pair of memory blocks 120-1 and 120-2. In some embodiments, first top select structure 116-1 divides a top conductor layer 114 into a pair of top select conductor layers, each located in the respective memory block (e.g., 120-1 or 120-2). In some embodiments, bottom select structure 131 divides a bottom conductor layer 112 into a pair of bottom select conductor layers 112-*a* and 112-*b*, each located in the respective memory blocks (e.g., 120-1 or 120-2). In some embodiments, stack structure 111 may include at least one second top select structure 116-2 aligned in parallel with first top select structure 116-1 in each memory block (e.g., 120-1 or 120-2). Second top select structures 116-2 may divide the respective memory block (e.g., 120-1 or 120-2) into a plurality of memory fingers (e.g., memory fingers 41 and 42 in memory block 120-1, and memory fingers 43 and 44 in memory block 120-2). Specifically, second top select structures 116-2 may further divide the respective top select conductor layer in the respective memory block into a plurality of top select conductor sub-layers (e.g., 114*a*, 114*b*, 114*c*, or 114*d*). Each memory finger (e.g., 41, 42, 43, or 44) may correspond to a respective top select conductor sub-layer (e.g., 114*a*, 114*b*, 114*c*, or 114*d*). When a voltage is applied on a desired top select conductor sub-layer (e.g., 114*a*, 114*b*, 114*c*, or 114*d*) and a desired bottom select conductor layer 112-*a* or 112-*b*, a desired memory finger or memory page can be selected.

Substrate 100 can include silicon (e.g., single crystalline silicon), silicon germanium (SiGe), gallium arsenide (GaAs), germanium (Ge), silicon on insulator (SDI), germanium on insulator (GOI), or any other suitable materials. In some embodiments, substrate 100 is a thinned substrate (e.g., a semiconductor layer), which was thinned by grinding, etching, chemical mechanical polishing (CMP), or any combination thereof. In some embodiments, substrate 100 includes silicon.

In some embodiments, 3D memory device 150 includes an array of channel structures 130 each extending vertically above substrate 100. Channel structure 130 may extend through a plurality of pairs each including a conductor layer (e.g., 114, 103, or 112) and an insulating layer 104 (referred to herein as "conductor/insulating layer pairs"). In some embodiments, a buffer oxide layer 101 is formed between substrate 100 and stack structure 111. At least on one side along a horizontal direction (e.g., x-direction or y-direction), stack structure 111 can include a staircase structure (not shown). The number of the conductor/insulating layer pairs in stack structure 111 (e.g., 32, 64, 96, or 128) determines the number of memory cells in 3D memory device 150. In some embodiments, conductor layers (e.g., 114, 103, or 112) and insulating layers 104 in stack structure 111 are alternatingly arranged along the vertical direction. Conductor layers (e.g., 114, 103, or 112) can include conductive materials including, but not limited to, tungsten (W), cobalt (Co), copper (Cu), aluminum (Al), polysilicon, doped silicon, silicides, or any combination thereof. Insulating layers 104 can include dielectric materials including, but not limited to, silicon oxide, silicon nitride, silicon oxynitride, or any combination thereof. In some embodiments, buffer oxide layer 101 and dielectric cap layer 105 each includes a dielectric material such as silicon oxide. In some embodiments, top select conductor sub-layers (e.g., 114*a*, 114*b*, 114*c*, or 114*d*) function as top select gate electrodes, control conductor layers 103 function as select gate electrodes and form memory cells with intersecting channel structures 130, and bottom select conductor layers 112-*a* and 112-*b* function as bottom select gate electrodes. Top select gate electrodes and bottom select gate electrodes can respectively be applied with desired to select a desired memory block/finger/page.

As shown in FIG. 1B, channel structure 130 can include a semiconductor channel 119 extending vertically through stack structure 111. Semiconductor channel 119 can include a channel hole filled with a channel-forming structure, e.g., semiconductor materials (e.g., as a semiconductor layer 108) and dielectric materials (e.g., as a memory film 107). In some embodiments, semiconductor layer 108 includes silicon, such as amorphous silicon, polysilicon, or single crystalline silicon. In some embodiments, memory film 107 is a composite layer including a tunneling layer, a memory layer (also known as a "charge trap layer"), and a blocking layer. The remaining space of the channel hole of semiconductor channel 119 can be partially or fully filled with a dielectric core 109 including dielectric materials, such as silicon oxide. Semiconductor channel 119 can have a cylinder shape (e.g., a pillar shape). Dielectric core 109, semiconductor layer 108, the tunneling layer, the memory layer, and the blocking layer are arranged radially from the center toward the outer surface of the pillar in this order, according to some embodiments. The tunneling layer can include silicon oxide, silicon oxynitride, or any combination thereof. The memory layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 107 can include a composite layer of silicon oxide/silicon oxynitride (or silicon nitride)/silicon oxide (ONO).

In some embodiments, channel structure 130 further includes an epitaxial portion 117 (e.g., a semiconductor plug) in the lower portion (e.g., at the lower end of bottom) of channel structure 130. As used herein, the "upper end" of a component (e.g., channel structure 130) is the end farther away from substrate 100 in the vertical direction, and the "lower end" of the component (e.g., channel structure 130) is the end closer to substrate 100 in the vertical direction when substrate 100 is positioned in the lowest plane of 3D memory device 150. Epitaxial portion 117 can include a semiconductor material, such as silicon, which is epitaxially grown from substrate 100 in any suitable directions. It is understood that in some embodiments, epitaxial portion 117 includes single crystalline silicon, the same material as substrate 100. In other words, epitaxial portion 117 can include an epitaxially-grown semiconductor layer grown from substrate 100. Epitaxial portion 117 can also include a different material than substrate 100. In some embodiments, epitaxial portion 117 includes at least one of silicon, germanium, and silicon germanium. In some embodiments, part of epitaxial portion 117 is above the top surface of substrate 100 and in contact with semiconductor channel 119. Epitaxial portion 117 may be conductively connected to semiconductor channel 119. In some embodiments, a top surface of epitaxial portion 117 is located between a top surface and a bottom surface of a bottom insulating layer 104 (e.g., the insulating layer at the bottom of stack structure 111).

In some embodiments, channel structure 130 further includes drain structure 110 (e.g., channel plug) in the upper portion (e.g., at the upper end) of channel structure 130. Drain structure 110 can be in contact with the upper end of semiconductor channel 119 and may be conductively connected to semiconductor channel 119. Drain structure 110 can include semiconductor materials (e.g., polysilicon) or conductive materials (e.g., metals). In some embodiments, drain structure includes an opening filled with Ti/TiN or Ta/TaN as an adhesion layer and tungsten as a conductor material. By covering the upper end of semiconductor channel 119 during the fabrication of 3D memory device 150, drain structure 110 can function as an etch stop layer to prevent etching of dielectrics filled in semiconductor channel 119, such as silicon oxide and silicon nitride.

First top select structure 116-1 and bottom select structure 131 may be aligned vertically and divide the memory cells in 3D memory device 150 into a pair of memory blocks 120-1 and 120-2. First top select structure 116-1 and bottom select structure 131 may each extend along the x-direction. Bottom select structure 131 may extend vertically through bottom conductor layer 112 and divide bottom conductor layer 112 into a pair of bottom select conductor layers 112a and 112b. Each one of bottom select conductor layers 112a and 112b may be biased to select a respective memory block (e.g., 120-1 or 120-2). In some embodiments, a top surface of bottom select structure 131 is coplanar with top surfaces of bottom conductor layer 112 and a bottom surface of bottom select structure 131 is between the top and bottom surfaces of buffer oxide layer 101. First top select structure 116-1 may extend vertically through top conductor layer 114 of and divide top conductor layer 114 into a pair of top select conductor layers. In some embodiments, first top select structure 116-1 and bottom select structure 131 are only positioned at the boundaries of memory blocks (or between memory blocks) and are not formed in a memory block.

In some embodiments, 3D memory device 150 may include at least one second top select structure 116-2 aligned in parallel with first top select structure 116-1 in at least one of memory blocks 120-1 and 120-2. In some embodiments, the number of second top select structure 116-2 in each block is an integer equal to or greater than zero. In some embodiments, as shown in FIGS. 1A and 1B, second top select structures 116-2 may divide the respective top select conductor layer into a plurality of top select conductor sub-layers (e.g., 114a, 114b, 114c, and 114d), and divide memory cells of the respective memory block (e.g., 120-1 or 120-2) into a plurality of memory fingers, e.g., 41, 42, 43, and 44. Each memory finger may be selected/controlled by applying a voltage on a corresponding top select conductor sub-layer, e.g., 114a, 114b, 114c, or 114d, and a corresponding bottom select conductor layer 112a or 112b. Dielectric cap layer 105 is omitted in FIG. 1A for ease of viewing. In some embodiments, a top surface of a top select structure (e.g., first top select structure 116-1 and second top select structure 116-2) may be coplanar with a top surface of dielectric cap layer 105, and a bottom surface of a top select structure may be positioned between a top surface and a bottom surface of the top insulating layer 104 (e.g., insulating layer 104 under top conductor layer 114). In other words, a top select structure may extend vertically through top conductor layer 114 and divide top conductor layers 114 into a plurality of top select conductor sub-layers (e.g., 114a-114d), each for controlling a corresponding memory finger (e.g., 41-44). In some embodiments, a number of channel structures 130 between adjacent top select structures 116 (e.g., between first top select structure 116-1 and second top select structure 116-2, or between second top select structures 116-2) may be any suitable number equal to or greater than 1. For example, at least two channel structures 130 may be arranged along the y-direction between adjacent top select structures 116. In some embodiments, the number of channel structures 130 between adjacent top select structures 116 may vary at different areas, e.g., forming memory fingers of different memory cells, depending on the design and/or fabrication process.

In some embodiments, the vertical dimensions of bottom select structure 131 and top select structures 116 vary depending on the design and/or fabrication process. For example, bottom select structure 131 and top select structures 116 may extend vertically through and divide more than one conductor layers, forming select conductor layers/sub-layers in more than one level. The specific number of conductor layers divided by each of bottom select structure 131 and top select structures 116 should not be limited by the embodiments of the present disclosure. In some embodiments, bottom select structure 131 and top select structures 116 may each include one or more of silicon oxide, silicon nitride, and silicon oxynitride.

3D memory device 150 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND channel structures) is constrained by the thermal budget associated with the peripheral devices that have been formed or to be formed on the same substrate.

Alternatively, 3D memory device 150 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 150, such as page buffers, decoders, and latches; not shown) is flipped and faces down toward the memory array device (e.g., NAND memory strings) for hybrid bonding. It is understood that in some embodiments, the memory array device substrate (e.g., substrate 100) is flipped and faces down toward the peripheral device (not shown) for hybrid bonding, so that in the bonded non-monolithic 3D memory device, the memory array device is above the peripheral device. The memory array device substrate (e.g., substrate 100) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

Figure 2:
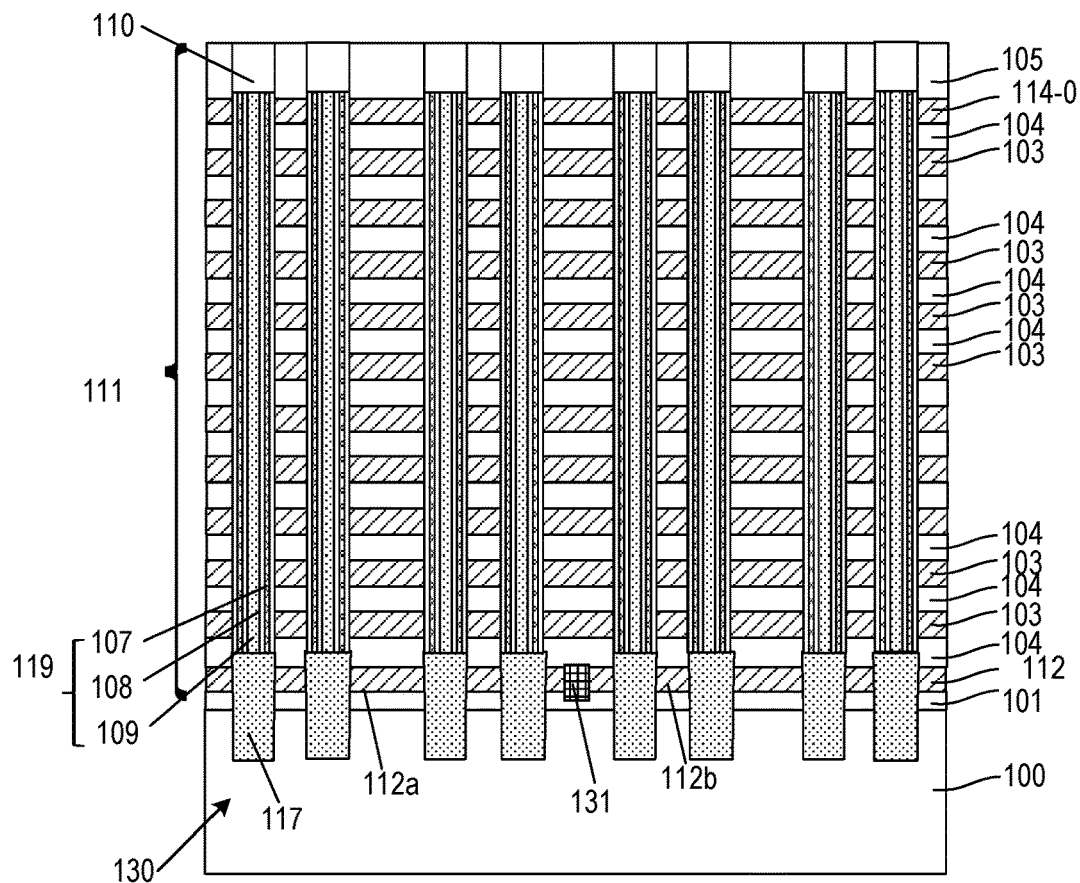
FIGS. 2-4 illustrate cross-sectional views of a 3D memory device at various stages of a fabrication process, according to some embodiments of the present disclosure.
Figure 3:
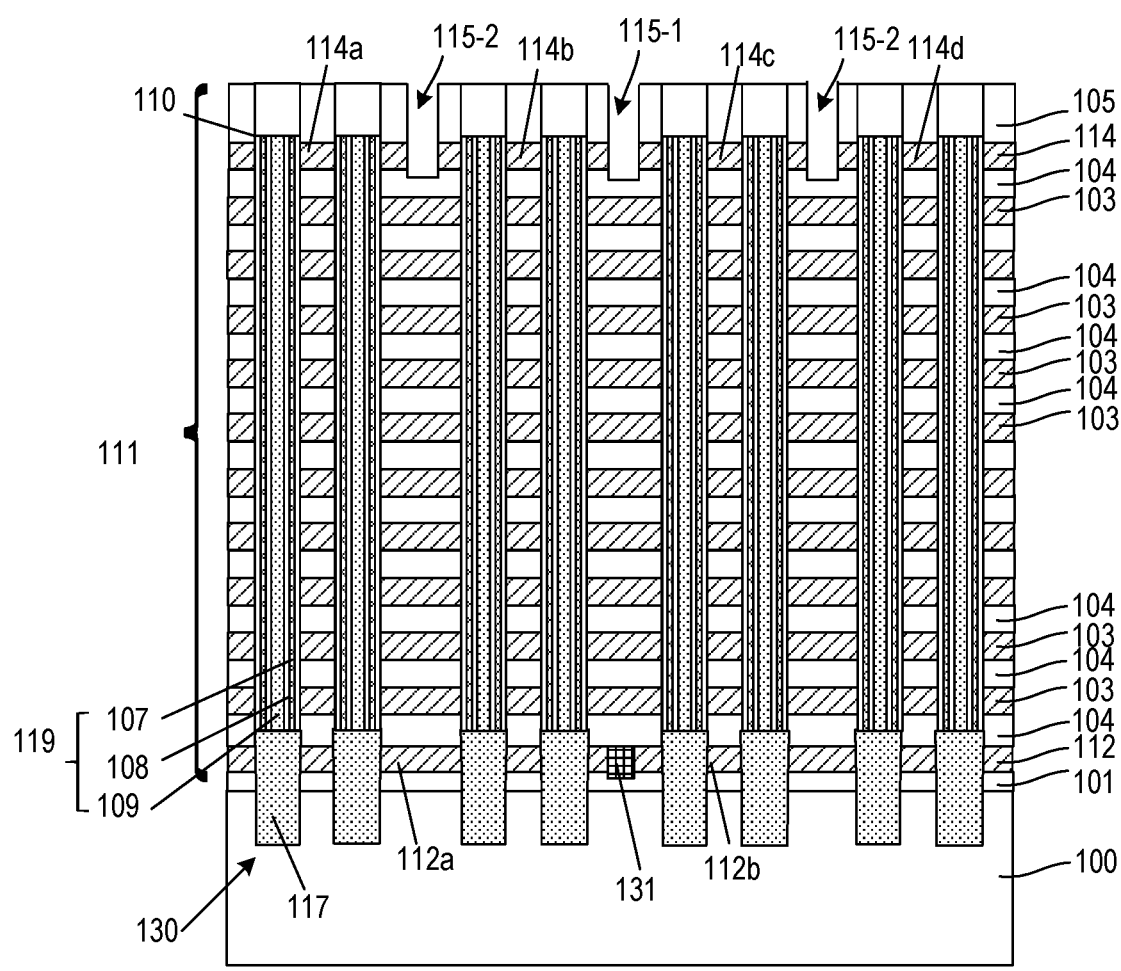
Figure 4:
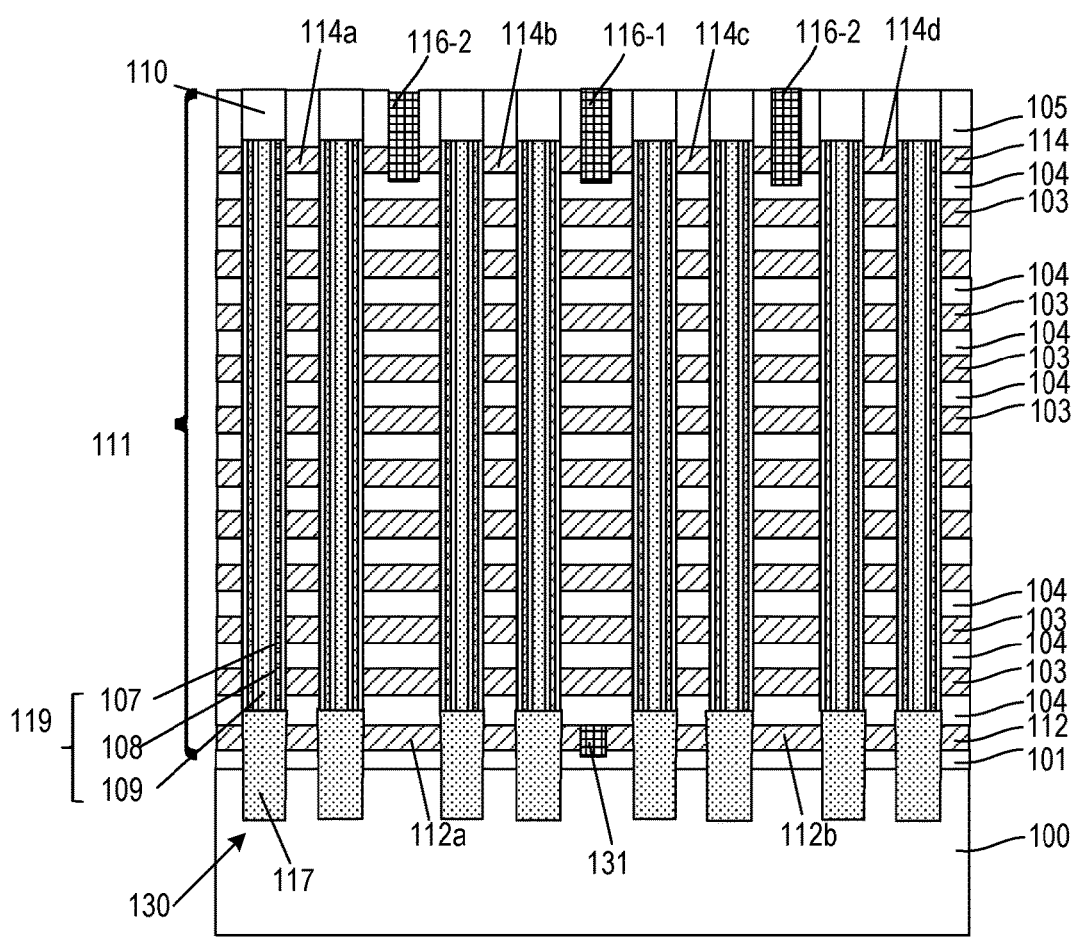

FIGS. 2-4 illustrate a fabrication process to form a 3D memory device shown in FIGS. 1A and 1B. FIG. 6 is a flowchart of a method 600 illustrated in FIGS. 2-4. For ease of illustration, same or similar parts are labeled with the same numerals in FIGS. 1-5 of the present disclosure.

At the beginning of the operation, a bottom select structure extending through a bottom conductor material layer is formed over a substrate (Operation 602). FIG. 2 illustrates a corresponding structure 200.

As shown in FIG. 2, bottom select structure 131 may be formed over substrate 100. In some embodiments, buffer oxide layer 101 may be deposited over substrate 100 and a bottom conductor material layer may be deposited over buffer oxide layer 101. A bottom opening, for subsequent formation of bottom select structure 131, may be formed in the bottom conductor material layer. A bottom surface of the bottom opening may be between a top surface and the bottom surface of buffer oxide layer 101. The bottom opening may extend horizontally, e.g., along the x-direction. A dielectric material may be deposited to fill up the bottom opening. In some embodiments, a planarization process (e.g., a chemical mechanical polishing (CMP) and/or a recess etch) is performed to remove any excess dielectric material from the deposition process. Bottom select structure 131 may be formed, dividing the bottom conductor material layer into two portions, which subsequently form a pair of bottom select conductor layers 112a and 112b.

In some embodiments, the bottom opening may be formed by patterning the bottom conductor material layer using an anisotropic etching process, e.g., dry etch. In some embodiments, buffer oxide layer 101 and bottom select structure 131 each include silicon oxide and is formed by at least one of physical vapor deposition (PVD), chemical vapor deposition (CVD), atomic layer deposition (ALD), and sputtering. In some embodiments, the bottom conductor material layer includes tungsten and is deposited by at least one of PVD, CVD, ALD, and sputtering.

Referring back to FIG. 6, after the formation of bottom select structure 131, a plurality of conductor layers and a plurality of insulating layers are formed over a pair of bottom select conductor layers 112a and 112b and the bottom select structure (Operation 604). FIG. 2 illustrates the corresponding structure 200.

As shown in FIG. 2, a plurality of conductor layers (e.g., control conductor layers 103 and top conductor layer 114-0) and a plurality of insulating layers 104 may be formed and interleaved over bottom select structure 131 and the pair of bottom select conductor layers 112a and 112b. Conductor layer 114-0 represents the top conductor layer. In some embodiments, dielectric cap layer 105 is deposited over top conductor layers 114-0. The plurality of conductor layers (e.g., 103 and 114-0) and the plurality of insulating layers 104 may form stack structure 111, which may have a staircase structure.

The staircase structure can be formed by repetitively etching a material stack that includes a plurality of interleaved conductor material layers and insulating material layers using an etch mask, e.g., a patterned PR layer over the material stack. The interleaved conductor material layers and the insulating material layers can be formed by alternatingly depositing layers of conductor material and layers of insulating material over bottom conductor layer 112 until a desired number of layers is reached. In some embodiments, an insulating material layer is deposited over the bottom conductor material layer, and a conductor material layer is deposited over the insulating material layer, so on and so forth. The conductor material layers and insulating material layers can have the same or different thicknesses. In some embodiments, a conductor material layer and the underlying insulating material layer are referred to as a conductor/insulating pair. In some embodiments, one or more conductor/insulating pairs can form one level/staircase. During the formation of the staircase structure, the PR layer is trimmed (e.g., etched incrementally and inwardly from the boundary of the material stack, often from all directions) and used as the etch mask for etching the exposed portion of the material stack. The amount of trimmed PR can be directly related (e.g., determinant) to the dimensions of the staircases. The trimming of the PR layer can be obtained using a suitable etch, e.g., an isotropic dry etch such as a wet etch. One or more PR layers can be formed and trimmed consecutively for the formation of the staircase structure. Each dielectric pair can be etched, after the trimming of the PR layer, using suitable etchants to remove a portion of both the conductor material layer and the underlying insulating material layer. The etched conductor material layers (e.g., including the bottom conductor material layer and the conductor material layers formed over the bottom conductor material layer) and insulating material layers may form conductor layers (e.g., 114-0, 103, and 112) and insulating layers 104. The PR layer can then be removed. In some embodiments, the top conductor material layer form top conductor layer 114-0, which subsequently forms top select conductor sub-layers 114a-114b. In some embodiments, the bottom conductor material layer can form bottom conductor layer 112 and the pair of bottom select conductor layers 112a and 112b. In some embodiments, the conductor material layers between the top and the bottom conductor material layers form control conductor layers 103, which function as the word lines of 3D memory device 150.

In some embodiments, the insulating material layers include silicon oxide, and the deposition of insulating material layers include one or more of CVD, PVD, ALD, and sputtering. In some embodiments, the conductor material layers include tungsten, and the deposition of insulating material layers include one or more of CVD, PVD, ALD, and sputtering. In some embodiments, the etching of the conductor material layers and the insulating material layers includes one or more suitable anisotropic etching process, e.g., dry etch. In some embodiments, the etchant has different etching selectivities on the conductor material layers and the insulating material layers.

Referring back to FIG. 6, after the conductor layers and the insulating layers are formed, a plurality of channel structures are formed in the stack structure. The channel structures may extend through the stack structure and into the substrate (Operation 606). FIG. 2 illustrates the corresponding structure 200.

As shown in FIG. 2, a plurality of channel structures 130 may be formed extending through dielectric cap layer 105, the conductor layers (114-0, 103, and 112), buffer oxide layer 101, and into substrate 100.

A plurality of channel holes may be formed through stack structure 111. In some embodiments, a plurality of channel holes are formed through the interleaved conductor layers (114-0, 103, and 112) and insulating layers 104. The plurality of channel holes may be formed by performing an anisotropic etching process, using an etch mask such as a patterned PR layer, to remove portions of stack structure 111 and expose substrate 100. In some embodiments, a plurality of channel holes are formed on each side of bottom select structure 131 along the x-direction. A recess region may be formed at the bottom of each channel hole to expose a top portion of substrate 100 by the same etching process that forms the channel hole above substrate 100 and/or by a separate recess etching process. In some embodiments, a semiconductor plug is formed at the bottom of each channel hole, e.g., over the recess region. The semiconductor plug may be formed by an epitaxial growth process and/or a deposition process. In some embodiments, the semiconductor plug is formed by epitaxial growth and is referred to as epitaxial portion 117. Optionally, a recess etch (e.g., dry etch and/or wet etch) may be performed to remove excess semiconductor material on the sidewall of the channel hole and/or control the top surface of epitaxial portion 117 at a desired position. In some embodiments, the top surface of epitaxial portion 117 is located between the top and bottom surfaces of the bottom insulating layer 104.

In some embodiments, the channel holes are formed by performing a suitable etching process, e.g., an anisotropic etching process (e.g., dry etch) and/or an isotropic etching process (wet etch). In some embodiments, epitaxial portion 117 includes single crystalline silicon is formed by epitaxially grown from substrate 100. In some embodiments, epitaxial portion 117 includes polysilicon formed by a deposition process. The formation of epitaxially-grown epitaxial portion 117 can include, but not limited to, vapor-phase epitaxy (VPE), liquid-phase epitaxy (LPE), molecular-beam epitaxy (MPE), or any combinations thereof. The formation of deposited epitaxial portion 117 may include, but not limited by, CVD, PVD, and/or ALD.

In some embodiments, a semiconductor channel 119 is formed over and contacting epitaxial portion 117 in the channel hole. Semiconductor channel can include a channel-forming structure that has a memory film 107 (e.g., including a blocking layer, a memory layer, and a tunneling layer), a semiconductor layer 108 formed above and connecting epitaxial portion 117, and a dielectric core 109 filling up the rest of the channel hole. In some embodiments, memory film 107 is first deposited to cover the sidewall of the channel hole and the top surface of epitaxial portion 117, and semiconductor layer 108 is then deposited over memory film 107 and above epitaxial portion 117. The blocking layer, memory layer, and tunneling layer can be subsequently deposited in this order using one or more thin film deposition processes, such as ALD, CVD, PVD, any other suitable processes, or any combination thereof, to form memory film 107. Semiconductor layer 108 can then be deposited on the tunneling layer using one or more thin film deposition processes, such as ALD, CVD, PVD, any other suitable processes, or any combination thereof. In some embodiments, dielectric core 109 is filled in the remaining space of the channel hole by depositing dielectric materials after the deposition of semiconductor layer 108, such as silicon oxide.

In some embodiments, drain structure 110 is formed in the upper portion of each channel hole. In some embodiments, parts of memory film 107, semiconductor layer 108, and dielectric core 109 on the top surface of stack structure 111 and in the upper portion of each channel hole can be removed by CMP, grinding, wet etching, and/or dry etching to form a recess in the upper portion of the channel hole so that a top surface of semiconductor channel may be between the top surface and the bottom surface of dielectric cap layer 105. Drain structure 110 then can be formed by depositing conductive materials, such as metals, into the recess by one or more thin film deposition processes, such as CVD, PVD, ALD, electroplating, electroless plating, or any combination thereof. A channel structure 130 is thereby formed. A plurality of memory cells may be formed by the intersection of semiconductor channels 119 and control conductor layers 103. Optionally, a planarization process, e.g., dry/wet etch and/or CMP, is performed to remove any excess material on the top surface of stack structure 111.

Referring back to FIG. 6, after the formation of channel structures, a first top select structure is formed, aligned with the bottom select structure along the vertical direction and dividing the top conductor layer into a pair of top select conductor layers (Operation 608). FIGS. 3 and 4 illustrate corresponding structures 300 and 400.

As shown in FIG. 4, a first top select structure 116-1 may be formed in stack structure 111. Vertically, first top select structure 116-1 may be aligned with bottom select structure 131 and may extend from the top surface of stack structure 111 into the first insulating layer 104. Horizontally, first top select structure 116-1 may extend along the x-direction, parallel with bottom select structure 131. First top select structure 116-1 may divide top conductor layer 114 into a pair of top select conductor layers. First top select structure 116-1 and bottom select structure 131 may divide memory cells in stack structure 111 into a pair of memory blocks (e.g., 120-1 and 120-2 in FIG. 1B). In some embodiments, one or more second top select structures 116-2 are formed in a respective memory block (e.g., 120-1 or 120-2) to further divide the respective top select conductor layer into a plurality of top select conductor sub-layers (114a-114d in FIGS. 1A and 1B) and divide the memory block into a plurality of memory fingers (e.g., 41-44 in FIGS. 1A and 1B). Second top select structures 116-2 may have similar or the same dimensions as first top select structure 116-1 and may extend in parallel with first top select structure 116-1 along the x-direction.

As shown in FIG. 3, first top select structure 116-1 may be formed by removing a portion of stack structure 111 to form a first top opening 115-1. A suitable anisotropic etching process and an etch mask (e.g., a patterned PR layer) may be employed to form first top opening 115-1, which exposes an underlying insulating layer 104 (e.g., the top insulating layer 104 under top select conductor sub-layers). A suitable dielectric material may be deposited to fill up first top select structure 116-1. In some embodiments, second top select structures 116-2 may be formed by the same fabrication processes that form first top select structure 116-1. For example, one or more second top openings 115-2 may be formed on each side of first top opening 115-1 along the x-direction with the same patterning process that forms first top opening 115-1. Second top openings 115-2 may be filled using the same dielectric material. In some embodiments, first top opening 115-1 and second top openings 115-2 are formed using an anisotropic etching process, e.g., dry etch. A suitable dielectric material, e.g., silicon oxide, may be deposited using one or more thin film deposition processes, such as ALD, CVD, PVD, any other suitable processes, or any combination thereof. Optionally, a planarization process, e.g., dry/wet etch and/or CMP, is performed to remove any excess dielectric material on the top surface of stack structure 111.

Figure 5:
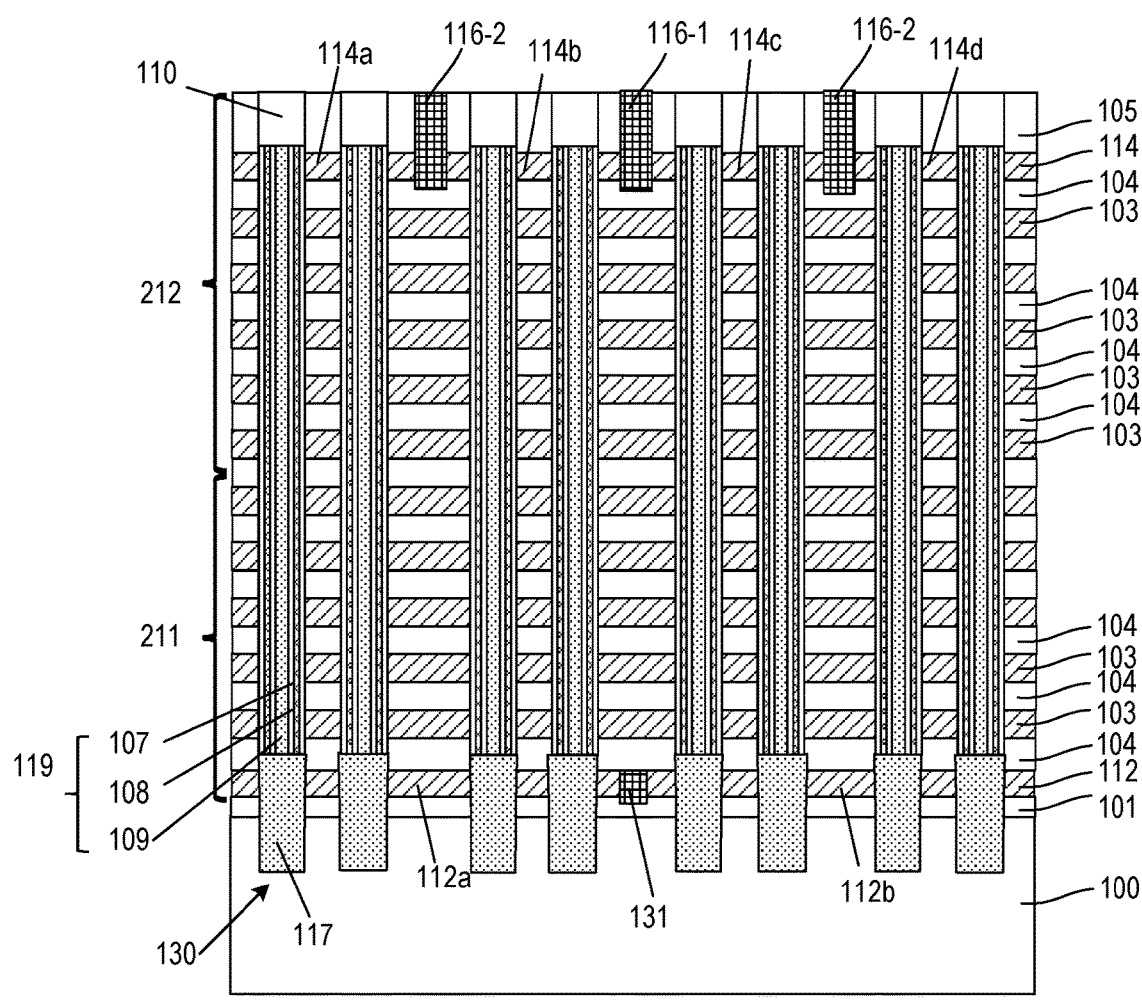
FIG. 5 illustrates a cross-sectional view of another exemplary 3D memory device having a dual-deck structure and without GLSs, according to some embodiments of the present disclosure.
Figure 6:
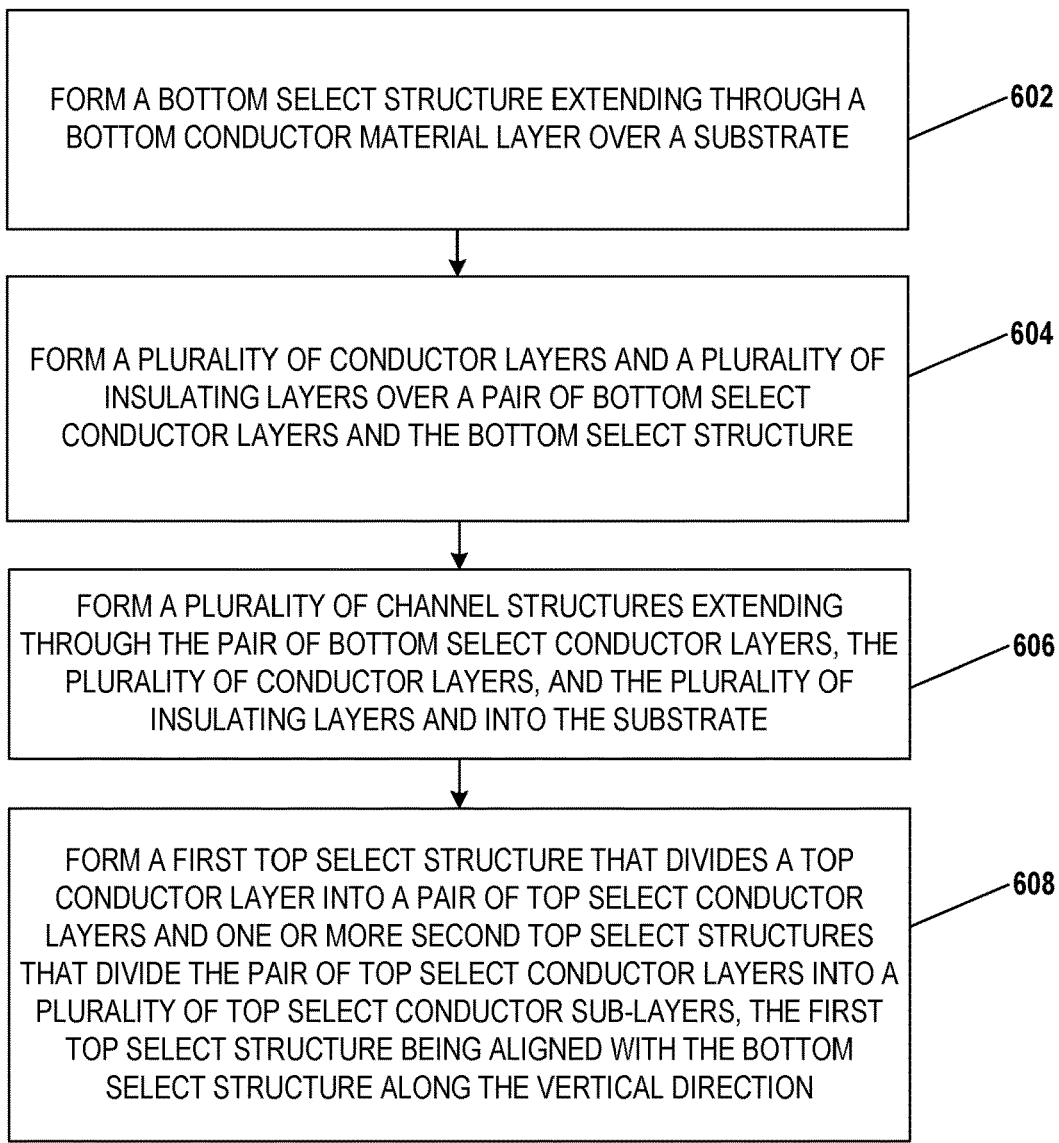
FIG. 6 illustrates a flowchart of an exemplary fabrication process for forming a 3D memory device without GLSs, according to some embodiments of the present disclosure.
Figure 7:
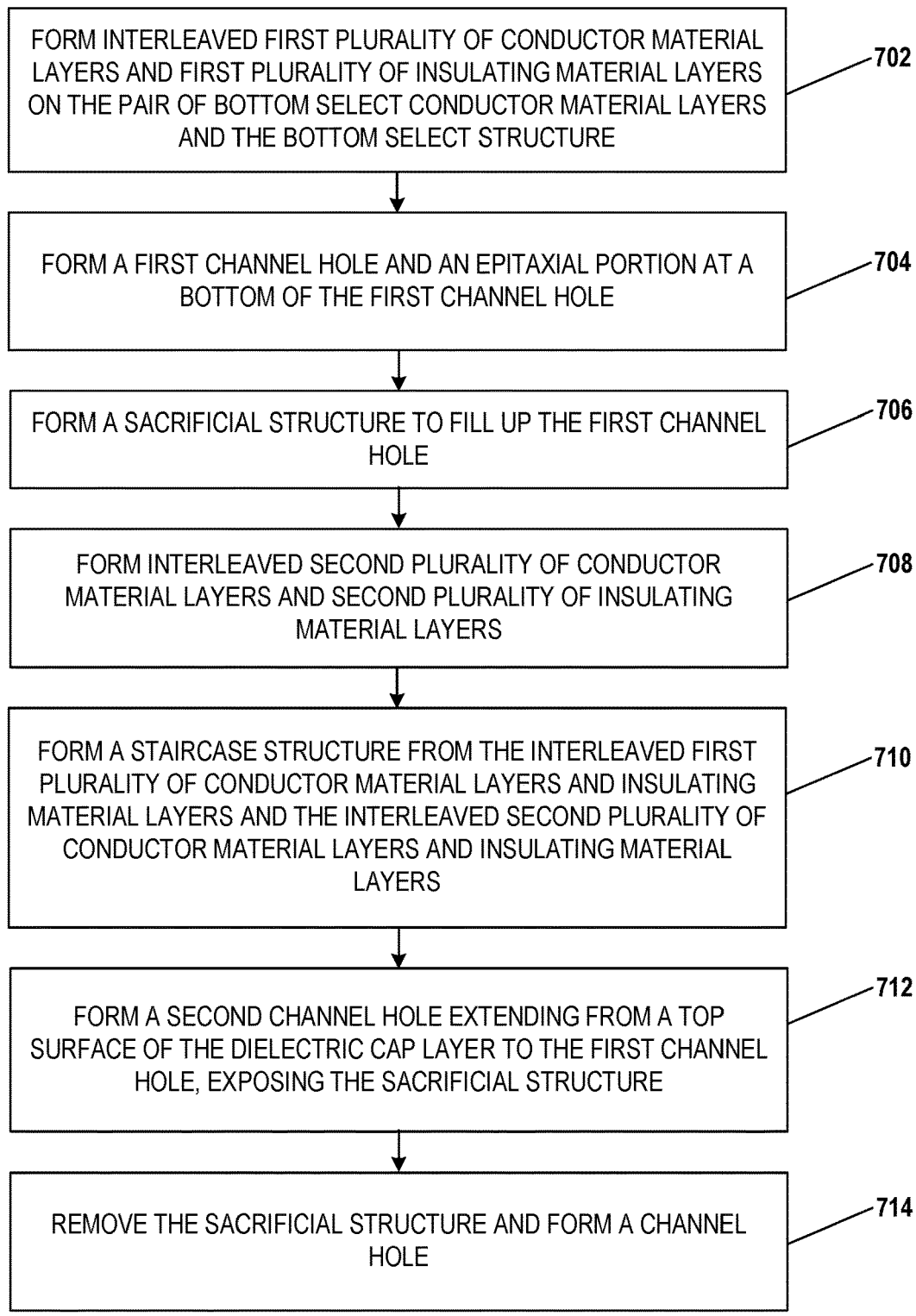
FIG. 7 illustrates a flowchart of an exemplary fabrication process for forming the 3D memory device having a dual-deck structure and without GLSs, according to some embodiments of the present disclosure.

FIG. 5 illustrates another exemplary 3D memory device 500 without GLSs or ACSs in the GLSs, according to some embodiments. 3D memory device 500 may have a structure similar to 3D memory device 150 and may be formed by forming channel structures in a dual-deck stack structure 111. As shown in FIG. 5, stack structure 111 includes a first deck 211 and a second deck 212, in which memory cells are formed. In some embodiments, more conductor/insulating layer pairs can be formed in 3D memory device 500, allowing more memory cells to be formed. Different from the formation of stack structure 111 of FIGS. 2-4, in which the conductor material layers and insulating material layers are deposited continuously and channel holes are formed by a single etching process, conductor material layers and insulating material layers that form first and second decks 211 and 212 are deposited separately. The channel holes are formed by jointly connecting the channel holes in first and second decks 211 and 212. FIG. 7 illustrates a flowchart of a method 700 to form the memory cells in stack structure 111 of FIG. 5. Method 700 may be performed after Operation 602 and before Operation 608, to form stack structure 111 from a dual-deck structure. It should be noted that, in various embodiments, the fabrication method can also be used to form 3D memory devices from other multi-deck structures (e.g., the number of decks being greater than 2). Details of fabrication processes to form other multi-deck structures can be similar to the fabrication process to form stack structure 111 from a dual-deck structure and are not described herein. The fabrication process to form other parts of 3D memory device 500, such as bottom select structure 131, first top select structure 116-1, and second top select structures 116-2 may be similar to or the same as the fabrication process illustrated in FIGS. 2-4, and are not repeated herein.

After the bottom select structure is formed, a first material stack having a first plurality of conductor material layers and a first plurality of insulating material layers can be formed to be interleaved on the pair of bottom select conductor material layers and bottom select structure 131 (Operation 702). The first material stack can subsequently form the first deck 211 (e.g., lower deck). The deposition of the first plurality of conductor material layers and the first plurality of insulating material layers can be referred to the description of deposition of conductor material layers and insulating material layers illustrated in FIG. 2 and is not repeated herein.

A first channel hole may be formed to extend through the first material stack and into substrate 100 and an epitaxial portion 117 can be formed at the bottom of the first channel hole (Operation 704). The formation of the first channel hole and epitaxial portion 117 can be referred to the description of the formation of channel hole and epitaxial portion illustrated in FIG. 2 and is not repeated herein.

A sacrificial structure can be formed to fill in the first channel hole after epitaxial portion 117 is formed (Operation 706). The sacrificial structure can be formed by depositing a sacrificial material into the first channel hole. The sacrificial material may include any suitable material with sufficient stiffness and is different from epitaxial portion 117 (e.g., having a different etching selectivity than epitaxial portion 117). In some embodiments, the sacrificial material includes one or more of silicon oxide, silicon nitride, and polysilicon, and the deposition process includes one or more of CVD, PVD, and ALD. Optionally, a planarization process (e.g., CMP and/or recess etch) is performed to remove any excess material (e.g., sacrificial material) on the first material stack to provide a base for the deposition of the second material stack.

Further, the second material stack having a second plurality of conductor material layers and a second plurality of insulating material layers can be deposited to be interleaved over the first material stack (Operation 708). The second material stack may subsequently form second deck 212 (e.g., upper deck). The deposition of the second plurality of conductor material layers and the second plurality of insulating material layers can be referred to the description of deposition of conductor material layers and insulating material layers illustrated in FIG. 2 and is not repeated herein. In some embodiments, the numbers (e.g., 32, 64, or 96) of conductor material layers and insulating material layers in the first material stack and the second material stack can be the same or different, depending on the design and/or fabrication process, and should not be limited by the embodiments of the present disclosure. In some embodiments, a dielectric cap layer is formed over the second material stack.

A staircase structure can then be formed from repetitively etching the stacking first material stack and second material stack, e.g., the bottom conductor material layer, the first plurality of conductor material layers, the first plurality of insulating material layers, the second plurality of conductor material layers, and the second plurality of insulating material layers (Operation 710). In some embodiments, the staircase structure can form stack structure 111. The formation of the staircase structure can be referred to the description of the formation of the staircase structure illustrated in FIG. 2 and is not repeated herein.

A second channel hole may be formed to extend from a top surface of the dielectric cap layer to the first channel hole, exposing the sacrificial structure (Operation 712). In some embodiments, the second channel hole may be aligned with the first channel hole along the vertical direction so that the second channel hole can at least overlap with the first channel hole vertically to expose the sacrificial structure. The formation of the second channel hole can be referred to the description of the formation of channel hole illustrated in FIG. 2 and is not repeated herein.

Further, the sacrificial structure can be removed and a channel hole can be formed (Operation 714). A suitable etching process, e.g., an anisotropic etch such as dry etch, can be performed to remove the sacrificial structure so the first channel hole and the second channel hole can be connected to form the channel hole. In some embodiments, the etching process has a higher etching rate of the sacrificial structure over epitaxial portion 117 so at least a portion of epitaxial portion 117 can be retained after the removal of the sacrificial structure. After the channel hole is formed, a channel structure 130 can be formed using the fabrication process described in FIG. 2. 3D memory device 500 having a dual-deck structure can then be formed.

In some embodiments, a 3D memory device includes a stack structure. The stack structure may include a plurality of conductor layers and a plurality of insulating layers interleaved over a substrate. The plurality of conductor layers may include a pair of top select conductor layers divided by a first top select structure and a pair of bottom select conductor layers divided by a bottom select structure. The first top select structure and the bottom select structure may extend along a horizontal direction and are aligned along a vertical direction. A plurality of channel structures may extend along a vertical direction and into the substrate and are distributed on both sides of the top select structure and the bottom select structure.

In some embodiments, the top select structure and the bottom select structure divide memory cells formed by the plurality of conductor layers and the plurality of channel structures into a pair of memory blocks. Each of the pair of memory blocks may correspond to a respective top select conductor layer and a respective bottom select conductor layer.

In some embodiments, the 3D memory device further includes a buffer oxide layer between the stack structure and the substrate. The first top select structure may extend along the vertical direction from a top surface of the stack structure into a top insulating layer under the first conductor layer. The bottom select structure extends along the vertical direction from a top surface of the bottom conductor layer and into the buffer oxide layer.

In some embodiments, the 3D memory device further includes at least one second top select structure extending along the vertical direction from a top surface of the stack structure into the first insulating structure in a respective memory block and extending along the horizontal direction. The at least one second top select structure may be separated from the first top select structure by at least one channel structure along another horizontal direction perpendicular to the horizontal direction. The at least one second top select structure may divide the respective top select conductor layer into a plurality of top select conductor sub-layers and the respective memory block into a plurality of memory fingers. Each of the plurality of top select conductor sub-layers may correspond to a respective memory finger.

In some embodiments, the first top select structure, the at least one second top select structure, and the bottom select structure each includes at least one of silicon oxide, silicon nitride, or silicon oxynitride.

In some embodiments, the plurality of channel structures each includes an epitaxial portion conductively connected to the substrate, a top surface of the epitaxial portion being between a top surface and a bottom surface of a bottom insulating layer over the pair of bottom select conductor layers.

In some embodiments, the epitaxial portion includes at least one of silicon, germanium, or silicon germanium.

In some embodiments, the plurality of channel structures each includes a semiconductor channel over and conductively connected to the respective epitaxial portion. The semiconductor channel may include a blocking layer, a memory layer, a tunneling layer, a semiconductor layer, and a dielectric core arranged radially from a sidewall of the semiconductor channel towards a center of the semiconductor channel.

In some embodiments, the 3D memory device further includes a dielectric cap layer over the stack structure and a plurality of drain structure each being in the dielectric cap layer and conductively connected to a respective semiconductor channel. A top surface of the semiconductor channel may be between a top surface and a bottom surface of the dielectric cap layer. The plurality of drain structures may include at least one of silicon, germanium, or silicon germanium. The dielectric cap layer may include at least one of silicon oxide, silicon nitride, or silicon oxynitride.

In some embodiments, the substrate includes at least one of silicon, germanium, silicon germanium, silicon carbide, silicon on insulator, germanium on insulator, or III-V compounds. In some embodiments, the plurality of conductor layers and the pair of bottom select conductor layers each includes at least one of polysilicon, silicides, germanium, silicon germanium, copper, aluminum, cobalt, or tungsten. In some embodiments, the plurality of insulating layers include at least one of silicon oxide, silicon nitride, silicon oxynitride, or silicon carbon nitride.

In some embodiments, no array common source or gate line slit is formed in the stack structure, and the substrate is a body source.

In some embodiments, a method for forming a 3D memory device includes forming a bottom select structure extending along a vertical direction through a bottom conductor layer over a substrate and along a horizontal direction to divide the bottom conductor layer into a pair of bottom select conductor layers, forming a plurality of conductor layers and a plurality of insulating layers interleaved on the pair of bottom select conductor layers and the bottom select structure, and forming a plurality of channel structures extending along the vertical direction through the pair of bottom select conductor layers, the plurality of conductor layers, and the plurality of insulating layers and into the substrate. The method may further include forming a first top select structure extending along the vertical direction through a top conductor layer of the plurality of conductor layers and along the horizontal direction to divide the top conductor layer into a pair of top select conductor layers. The first top select structure and the bottom select structure may be aligned along the vertical direction and may divide a plurality of memory cells formed by the plurality of conductor layers and the plurality of channel structures into a pair of memory blocks.

In some embodiments, forming a bottom conductor layer includes forming a buffer oxide layer over the substrate and forming a bottom conductor material layer on the buffer oxide layer.

In some embodiments, forming the bottom select structure includes patterning the bottom conductor material layer to form a pair of bottom select conductor material layers and a bottom opening extending along the vertical direction through the pair of bottom conductor material layers and into the buffer oxide layer and along the horizontal direction. In some embodiments, forming the bottom select structure also includes depositing a dielectric material to fill up the bottom opening.

In some embodiments, the patterning of the bottom conductor material layer includes a dry etch process, and the depositing of the insulating material includes at least one of a CVD process, an ALD process, or a PVD process.

In some embodiments, forming the plurality of conductor layers and the plurality of insulating layers include depositing, alternatingly, a plurality of conductor material layers and a plurality of insulating material layers on the pair of bottom select conductor material layers. In some embodiments, forming the plurality of conductor layers and the plurality of insulating layers also include etching, repetitively, the pair of bottom select conductor material layers, the plurality of conductor material layers, and the plurality of insulating material layers to form a staircase structure of the pair of bottom select conductor layers, and the interleaved plurality of conductor layers and plurality of insulating layers over the substrate.

In some embodiments, forming a plurality of channel structures includes forming a channel hole extending along the vertical direction through a dielectric cap layer over the plurality of conductor layers and the plurality of insulating layers, the plurality of conductor layers, the plurality of insulating layers, and the pair of bottom select conductor layers into the substrate. The channel hole may be away from the bottom select structure along another horizontal direction perpendicular to the horizontal direction. In some embodiments, forming a plurality of channel structures also include performing a recess etch at the bottom of the channel hole to expose the substrate and performing an epitaxial deposition of a semiconductor material to fill up the bottom of the channel hole and form an epitaxial portion at a bottom of the channel hole. The epitaxial portion may contact and be conductively connected to the substrate. A top surface of the epitaxial portion may be between a top surface and a bottom surface of a bottom insulating layer over the pair of bottom select conductor layers. In some embodiments, forming a plurality of channel structures further includes depositing a channel-forming structure to fill up the channel hole and performing a recess etch on the channel-forming structure to form a semiconductor channel so that a top surface of the semiconductor channel is between a top surface and a bottom surface of the dielectric cap layer.

In some embodiments, forming the plurality of conductor layers and the plurality of insulating layers includes depositing, alternatingly, a first plurality of conductor material layers and a first plurality of insulating material layers on the pair of bottom select conductor material layers. In some embodiments, forming the plurality of conductor layers and the plurality of insulating layers also includes forming a first channel hole extending along the vertical direction through the first plurality of conductor material layers, the first plurality of insulating material layers, and the pair of bottom select conductor material layers and into the substrate. The first channel hole may be away from the bottom select structure along another horizontal direction perpendicular to the horizontal direction. In some embodiments, forming the plurality of conductor layers and the plurality of insulating layers further includes performing a recess etch at the bottom of the first channel hole to expose the substrate, performing an epitaxial deposition of a semiconductor material to fill up the bottom of the first channel hole. A top surface of the epitaxial portion may be between a top surface and a bottom surface of a bottom insulating layer over the pair of bottom select conductor material layers. In some embodiments, forming the plurality of conductor layers and the plurality of insulating layers further includes forming a sacrificial structure to fill up the first channel hole and forming a second plurality of conductor material layers and a second plurality of insulating material layers interleaved over the first plurality of conductor material layers, The plurality of insulating material layers, and the sacrificial structures. In some embodiments, forming the plurality of conductor layers and the plurality of insulating layers further includes etching, repetitively, the pair of bottom select conductor material layers, the first plurality of conductor material layers, the first plurality of insulating material layers, the second plurality of conductor material layers, the second plurality of insulating materials to form a staircase structure of the first plurality of conductor layers, the first plurality of insulating layers, the second plurality of conductor layers, and the second plurality of insulating layers interleaved over the pair of bottom select conductor layers on the substrate.

In some embodiments, forming a plurality of channel structures includes forming a second channel hole aligned with the respective first channel hole along the vertical direction, the second channel hole extending along the vertical direction through a dielectric cap layer over the second plurality of conductor material layers and the second plurality of insulating material layers, the second plurality of conductor layers, and the second plurality of insulating layers, and exposing the respective first channel hole and respective sacrificial structure. In some embodiments, forming the plurality of conductor layers and the plurality of insulating layers includes removing the sacrificial structure in the first channel hole to expose the epitaxial portion, the first channel hole and the second channel hole forming a channel hole. In some embodiments, forming the plurality of conductor layers and the plurality of insulating layers includes forming a channel-forming structure to fill up the channel hole and performing a recess etch on the channel-forming structure to form the semiconductor channel so that a top surface of the semiconductor channel is between a top surface and a bottom surface of the dielectric cap layer.

In some embodiments, forming a channel-forming structure includes depositing, sequentially, a layer of a blocking material, a layer of a memory material, a layer of a tunneling material, a layer of a semiconductor material, and a layer of a dielectric core material over a sidewall of the channel hole to fill up the channel hole.

In some embodiments, depositing the plurality of conductor material layers includes depositing at least one of polysilicon, silicides, germanium, silicon germanium, copper, aluminum, cobalt, or tungsten. In some embodiments, depositing the plurality of insulating material layers includes depositing at least one of silicon oxide, silicon nitride, silicon oxynitride, or silicon carbon nitride.

In some embodiments, the depositing of the plurality of conductor material layers includes performing at least one of a CVD process, a sputtering process, a PVD process, or an ALD process. In some embodiments, the depositing of the plurality of insulating material layers includes at least one of a CVD process, a PVD process, or an ALD process.

In some embodiments, forming a first top select structure includes patterning the dielectric cap layer to form a first top opening extending along the vertical direction from the top surface of the dielectric cap layer to a first insulating layer under the pair of top select conductor layers and along the horizontal direction. The first top opening may be aligned with the bottom select structure along the vertical direction. In some embodiments, forming a first top select structure also includes depositing a dielectric material to fill up the first top opening. The dielectric material may include at least one of silicon oxide, silicon nitride, or silicon oxynitride.

In some embodiments, the patterning of the dielectric cap layer includes a dry etch process, and the depositing of the insulating material includes at least one of a CVD process, an ALD process, or a PVD process.

In some embodiments, the method further includes forming at least one second top select structure in a respective memory block by a same process that forms the first top select structure. The at least one second top select structure may be formed by patterning the dielectric cap layer to form at least one second top opening in the respective memory block with a same patterning process the first top opening is being formed. The at least one second top opening may extend along the vertical direction from the top surface of the dielectric cap layer to the first insulating layer and along the horizontal direction. The at least one second top select structure may also be formed by depositing the dielectric material to fill up the at least one second top opening and form the at least one second top select structure when the first top opening is being filled with the dielectric material. The at least one second top select structure may divide the respective memory block into a plurality of memory fingers and divide the respective top select conductor layer into a plurality of top select conductor sub-layers. Each of the plurality of top select conductor sub-layers may correspond to a respective memory finger.

In some embodiments, the method further includes depositing a conductive material to fill up the channel hole over the semiconductor channel and form a drain structure. The drain structure may contact and be conductively connected with the semiconductor channel.

In some embodiments, a method for forming a 3D memory device includes forming a bottom select structure extending along a horizontal direction and dividing a bottom conductor layer over a substrate into a pair of bottom select conductor layers, forming a plurality of conductor layers and a plurality of insulating layers interleaved on the pair of bottom select conductor layers and the bottom select structure, and forming a plurality of channel structures extending along a vertical direction through the pair of bottom select conductor layers, the plurality of conductor layers, and the plurality of insulating layers and into the substrate. The plurality of channel structures may be distributed symmetrically on each side of the bottom select structure along another horizontal direction perpendicular to the horizontal direction. In some embodiments, the method also includes forming a plurality of top select structures extending along the horizontal direction and dividing a top conductor layer of the plurality of conductor layers into a plurality of top select conductor layers. The top select structures may include a first top select structure aligned with the bottom select structure along the vertical direction and at least one second top select structure on each side of the first top select structure along the other horizontal direction. The first top select structure and the bottom select structure may divide a plurality memory cells formed by the plurality of channel structures and the plurality of conductor layers into a pair of memory blocks, and the at least one second top structure on each side of the first top select structure dividing a respective memory block into a plurality of memory fingers.

In some embodiments, forming a bottom conductor layer includes forming a buffer oxide layer over the substrate and forming the bottom conductor material layer on the buffer oxide layer.

In some embodiments, forming the bottom select structure includes patterning the bottom conductor material layer to form a bottom opening extending along the vertical direction through the bottom conductor material layer and into the buffer oxide layer and along the horizontal direction and depositing a dielectric material to fill up the bottom opening.

In some embodiments, the patterning of the bottom conductor material layer includes a dry etch process, and the depositing of the insulating material includes at least one of a CVD process, an ALD process, or a PVD process.

In some embodiments, forming a plurality of conductor layers and a plurality of insulating layers includes depositing, alternatingly, a plurality of conductor material layers and a plurality of insulating material layers on the pair of bottom select conductor material layers and etching, repetitively, the pair of bottom select conductor material layers, the plurality of conductor material layers, and the plurality of insulating material layers to form a staircase structure of the pair of bottom select conductor layers, and the interleaved plurality of conductor layers and plurality of insulating layers over the substrate.

In some embodiments, forming a plurality of channel structures includes forming a channel hole extending along the vertical direction through a dielectric cap layer over the plurality of conductor layers and the plurality of insulating layers, the plurality of conductor layers, the plurality of insulating layers, and the pair of bottom select conductor layers into the substrate. The channel hole may be away from the bottom select structure along another horizontal direction perpendicular to the horizontal direction. In some embodiments, forming a plurality of channel structures includes performing a recess etch at the bottom of the channel hole to expose the substrate and performing an epitaxial deposition of a semiconductor material to fill up the bottom of the channel hole and form an epitaxial portion at a bottom of the channel hole. The epitaxial portion may contact and may be conductively connected to the substrate, a top surface of the epitaxial portion being between a top surface and a bottom surface of a bottom insulating layer over the pair of bottom select conductor layers. In some embodiments, forming a plurality of channel structures also includes depositing a channel-forming structure to fill up the channel hole and performing a recess etch on the channel-forming structure to form a semiconductor channel so that a top surface of the semiconductor channel is between a top surface and a bottom surface of the dielectric cap layer.

In some embodiments, forming the plurality of conductor layers and the plurality of insulating layers includes depositing, alternatingly, a first plurality of conductor material layers and a first plurality of insulating material layers on the pair of bottom select conductor material layers. In some embodiments, forming the plurality of conductor layers and the plurality of insulating layers also includes forming a first channel hole extending along the vertical direction through the first plurality of conductor material layers, the first plurality of insulating material layers, and the pair of bottom select conductor material layers and into the substrate. The first channel hole may be away from the bottom select structure along another horizontal direction perpendicular to the horizontal direction. In some embodiments, forming the plurality of conductor layers and the plurality of insulating layers further includes performing a recess etch at the bottom of the first channel hole to expose the substrate and performing an epitaxial deposition of a semiconductor material to fill up the bottom of the first channel hole. A top surface of the epitaxial portion may be between a top surface and a bottom surface of a bottom insulating layer over the pair of bottom select conductor material layers. In some embodiments, forming the plurality of conductor layers and the plurality of insulating layers further includes forming a sacrificial structure to fill up the first channel hole and forming a second plurality of conductor material layers and a second plurality of insulating material layers interleaved over the first plurality of conductor material layers, the plurality of insulating material layers, and the sacrificial structures. In some embodiments, forming the plurality of conductor layers and the plurality of insulating layers further includes etching, repetitively, the pair of bottom select conductor material layers, the first plurality of conductor material layers, the first plurality of insulating material layers, the second plurality of conductor material layers, the second plurality of insulating materials to form a staircase structure of the first plurality of conductor layers, the first plurality of insulating layers, the second plurality of conductor layers, and the second plurality of insulating layers interleaved over the pair of bottom select conductor layers on the substrate.

In some embodiments, forming a plurality of channel structures includes forming a second channel hole aligned with the respective first channel hole along the vertical direction. The second channel hole may extend along the vertical direction through a dielectric cap layer over the second plurality of conductor material layers and the second plurality of insulating material layers, the second plurality of conductor layers, and the second plurality of insulating layers, and expose the respective first channel hole and respective sacrificial structure. In some embodiments, forming a plurality of channel structures also includes removing the sacrificial structure in the first channel hole to expose the epitaxial portion, the first channel hole and the second channel hole forming a channel hole, and forming a channel-forming structure to fill up the channel hole and performing a recess etch on the channel-forming structure to form the semiconductor channel so that a top surface of the semiconductor channel is between a top surface and a bottom surface of the dielectric cap layer.

In some embodiments, forming a channel-forming structure includes depositing, sequentially, a layer of a blocking material, a layer of a memory material, a layer of a tunneling material, a layer of a semiconductor material, and a layer of a dielectric core material over a sidewall of the channel hole to fill up the channel hole.

In some embodiments, depositing the plurality of conductor material layers includes depositing at least one of polysilicon, silicides, germanium, silicon germanium, copper, aluminum, cobalt, or tungsten. In some embodiments, depositing the plurality of insulating material layers includes depositing at least one of silicon oxide, silicon nitride, silicon oxynitride, or silicon carbon nitride.

In some embodiments, the depositing of the plurality of conductor material layers includes performing at least one of a CVD process, a sputtering process, a PVD process, or an ALD process. In some embodiments, the depositing of the plurality of insulating material layers includes at least one of a CVD process, a PVD process, or an ALD process.

In some embodiments, forming the plurality of top select structures includes patterning the dielectric cap layer to form a plurality of top openings each extending along the vertical direction from the top surface of the dielectric cap layer to a first insulating layer under the pair of top select conductor layers and along the horizontal direction. The plurality of top openings may include a first top opening being aligned with the bottom select structure and the at least one second top opening on each side of the first top opening along the other horizontal direction. In some embodiments, forming the plurality of top select structures also includes depositing a dielectric material to fill up the plurality of top openings. The dielectric material may include at least one of silicon oxide, silicon nitride, or silicon oxynitride.

In some embodiments, the patterning of the dielectric cap layer includes a dry etch process, and the depositing of the insulating material includes at least one of a CVD process, an ALD process, or a PVD process.

In some embodiments, the method further includes depositing a conductive material to fill up the channel hole over the semiconductor channel and form a drain structure. The drain structure may contact and be conductively connected with the semiconductor channel.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a stack structure comprising a plurality of conductor layers and a plurality of insulating layers interleaved over a substrate, wherein the plurality of conductor layers comprises a pair of top select conductor layers divided by a first top select structure and a pair of bottom select conductor layers divided by a bottom select structure, the first top select structure and the bottom select structure extending along a horizontal direction and being aligned along a vertical direction, and
   a plurality of channel structures extending along a vertical direction and into the substrate and distributed on both sides of the top select structure and the bottom select structure.

2. The 3D memory device of claim 1, wherein the top select structure and the bottom select structure divide memory cells formed by the plurality of conductor layers and the plurality of channel structures into a pair of memory blocks, each of the pair of memory blocks correspond to a respective top select conductor layer and a respective bottom select conductor layer.

3. The 3D memory device of claim 2, further comprising a buffer oxide layer between the stack structure and the substrate, wherein
   the first top select structure extends along the vertical direction from a top surface of the stack structure into a top insulating layer under a first conductor layer; and
   the bottom select structure extends along the vertical direction from a top surface of the bottom conductor layer and into the buffer oxide layer.

4. The 3D memory device of claim 3, further comprising at least one second top select structure extending along the vertical direction from a top surface of the stack structure into a first insulating structure in a respective memory block and extending along the horizontal direction, the at least one second top select structure being separated from the first top select structure by at least one channel structure along another horizontal direction perpendicular to the horizontal direction, wherein the at least one second top select structure divides the respective top select conductor layer into a plurality of top select conductor sub-layers and the respective memory block into a plurality of memory fingers, each of the plurality of top select conductor sub-layers corresponding to a respective memory finger.

5. The 3D memory device of claim 4, wherein the first top select structure, the at least one second top select structure, and the bottom select structure each comprise at least one of silicon oxide, silicon nitride, or silicon oxynitride.

6. The 3D memory device of claim 1, wherein the plurality of channel structures each comprises:

an epitaxial portion conductively connected to the substrate, a top surface of the epitaxial portion being between a top surface and a bottom surface of a bottom insulating layer over the pair of bottom select conductor layers;

a semiconductor channel over and conductively connected to the respective epitaxial portion, the semiconductor channel comprises a blocking layer, a memory layer, a tunneling layer, a semiconductor layer, and a dielectric core arranged radially from a sidewall of the semiconductor channel towards a center of the semiconductor channel; and a drain structure in a dielectric cap layer and conductively connected to the semiconductor channel.

7. The 3D memory device of claim 1, wherein the substrate is a body source.

8. A three-dimensional (3D) memory device, comprising:

a stack structure comprising a plurality of conductor layers and a plurality of insulating layers interleaved over a substrate, wherein:

the plurality of conductor layers comprises a pair of top select conductor layers divided by a first top select structure and a pair of bottom select conductor layers divided by a bottom select structure, the first top select structure and the bottom select structure extending along a horizontal direction and being aligned along a vertical direction, and the substrate is configured to receive a source bias voltage; and a plurality of channel structures extending along a vertical direction and into the substrate and distributed on both sides of the top select structure and the bottom select structure.

9. The 3D memory device of claim 8, wherein the top select structure and the bottom select structure divide memory cells formed by the plurality of conductor layers and the plurality of channel structures into a pair of memory blocks, each of the pair of memory blocks correspond to a respective top select conductor layer and a respective bottom select conductor layer.

10. The 3D memory device of claim 9, further comprising a buffer oxide layer between the stack structure and the substrate, wherein the first top select structure extends along the vertical direction from a top surface of the stack structure into a top insulating layer under a first conductor layer; and the bottom select structure extends along the vertical direction from a top surface of the bottom conductor layer and into the buffer oxide layer.

11. The 3D memory device of claim 10, further comprising at least one second top select structure extending along the vertical direction from a top surface of the stack structure into a first insulating structure in a respective memory block and extending along the horizontal direction, the at least one second top select structure being separated from the first top select structure by at least one channel structure along another horizontal direction perpendicular to the horizontal direction, wherein the at least one second top select structure divides the respective top select conductor layer into a plurality of top select conductor sub-layers and the respective memory block into a plurality of memory fingers, each of the plurality of top select conductor sub-layers corresponding to a respective memory finger.

12. The 3D memory device of claim 11, wherein the first top select structure, the at least one second top select structure, and the bottom select structure each comprise at least one of silicon oxide, silicon nitride, or silicon oxynitride.

13. The 3D memory device of claim 8, wherein the plurality of channel structures each comprises:

an epitaxial portion conductively connected to the substrate, a top surface of the epitaxial portion being between a top surface and a bottom surface of a bottom insulating layer over the pair of bottom select conductor layers;

a semiconductor channel over and conductively connected to the respective epitaxial portion, the semiconductor channel comprises a blocking layer, a memory layer, a tunneling layer, a semiconductor layer, and a dielectric core arranged radially from a sidewall of the semiconductor channel towards a center of the semiconductor channel; and a drain structure in a dielectric cap layer and conductively connected to the semiconductor channel.

14. The 3D memory device of claim 8, wherein no array common source (ACS) is formed above the substrate.

15. The 3D memory device of claim 8, wherein no array common source (ACS) is formed between memory blocks in the stack structure.

16. A three-dimensional (3D) memory device, comprising:

a stack structure comprising a memory block that comprises plurality of conductor layers and a plurality of insulating layers interleaved over a substrate, wherein a boundary of the memory block comprises a first top select structure and a bottom select structure, each of the first top select structure and the bottom select structure extending along a horizontal direction and being aligned along a vertical direction with each other; and a plurality of channel structures extending along a vertical direction and into the substrate and distributed on both sides of the top select structure and the bottom select structure.

17. The 3D memory device of claim 16, wherein:

the plurality of conductor layers comprises a top select conductor layer and a bottom select conductor layer;

the top select conductor layer is between the pair of first top select structures; and the bottom select conductor layer is between the pair of bottom select structures.

18. The 3D memory device of claim 17, further comprising a buffer oxide layer between the stack structure and the substrate, wherein the first top select structures extend along the vertical direction from a top surface of the stack structure into a top insulating layer under a first conductor layer; and the bottom select structure extend along the vertical direction from a top surface of the bottom conductor layer and into the buffer oxide layer.

19. The 3D memory device of claim 18, further comprising at least one second top select structure extending along the vertical direction from a top surface of the stack structure into the a insulating structure in the memory block and extending along the horizontal direction, the at least one second top select structure being separated from the first top select structure by at least one channel structure along another horizontal direction perpendicular to the horizontal direction, wherein the at least one second top select structure divides the top select conductor layer into a plurality of top select conductor sub-layers and the memory block into a plurality of memory fingers, each of the plurality of top select conductor sub-layers corresponding to a respective memory finger.

20. The 3D memory device of claim 19, wherein the first top select structures, the at least one second top select structure, and the bottom select structure each comprise at least one of silicon oxide, silicon nitride, or silicon oxynitride.

\* \* \* \* \*